(12) United States Patent
Lian et al.

(10) Patent No.: US 7,378,700 B2
(45) Date of Patent: May 27, 2008

(54) SELF-ALIGNED V0-CONTACT FOR CELL SIZE REDUCTION

(75) Inventors: Jingyu Lian, Wallkill, NY (US); Nicolas Nagel, Kanagawa-ken (JP); Stefan Gernhardt, Kanagawa-ken (JP); Rainer Bruchhaus, Kanagawa-ken (JP); Andreas Hilliger, Kanagawa-ken (JP); Uwe Wellhausen, Dresden (DE)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 11/373,080

(22) Filed: Mar. 9, 2006

(65) Prior Publication Data

US 2006/0151819 A1    Jul. 13, 2006

Related U.S. Application Data

(62) Division of application No. 10/677,852, filed on Oct. 1, 2003, now Pat. No. 7,061,035.

(51) Int. Cl.
*H01L 29/76* (2006.01)
(52) U.S. Cl. .................... 257/295; 257/296
(58) Field of Classification Search ............... 257/1–5, 257/295, 296, 306, 310; 438/3, 653
See application file for complete search history.

(56) References Cited

U.S. PATENT DOCUMENTS

| | | | |
|---|---|---|---|
| 5,543,644 A | 8/1996 | Abt et al. | |
| 6,051,858 A | 4/2000 | Uchida et al. | |
| 6,249,014 B1 | 6/2001 | Bailey | |
| 6,423,592 B1 | 7/2002 | Sun | |
| 6,717,197 B2 | 4/2004 | An | |
| 6,720,600 B2 | 4/2004 | Okita | |
| 6,746,878 B2 | 6/2004 | Komuro et al. | |
| 6,809,360 B2 | 10/2004 | Kato | |
| 2001/0044205 A1* | 11/2001 | Gilbert et al. | 438/653 |
| 2003/0006439 A1 | 1/2003 | Bailey | |
| 2003/0059720 A1* | 3/2003 | Hwang et al. | 430/311 |
| 2003/0124791 A1 | 7/2003 | Summerfelt et al. | |
| 2003/0146460 A1 | 8/2003 | Zambrano et al. | |
| 2003/0155595 A1 | 8/2003 | Okita | |

* cited by examiner

*Primary Examiner*—Jerome Jackson
*Assistant Examiner*—Jami M Valentine
(74) *Attorney, Agent, or Firm*—Fish & Richardson P.C.

(57) ABSTRACT

An FeRAM comprising includes a ferroelectric material sandwiched between a top electrode and a bottom electrode. A V0-contact provides an electrical connection with an underlying CS-contact. The V0-contact is aligned using the bottom electrode. A liner layer covers a sidewall of the bottom electrode and provides a stop to an etch a hole forming the V0-contact. A method is utilized to form a V0-contact in an FeRAM comprising. An Fe capacitor of the FeRAM is encapsulated, a bottom electrode is etched, a liner layer is deposited covering a sidewall of the bottom electrode, and a hole is etched for the V0-contact until the etching is stopped by the liner layer.

10 Claims, 4 Drawing Sheets

New Layout

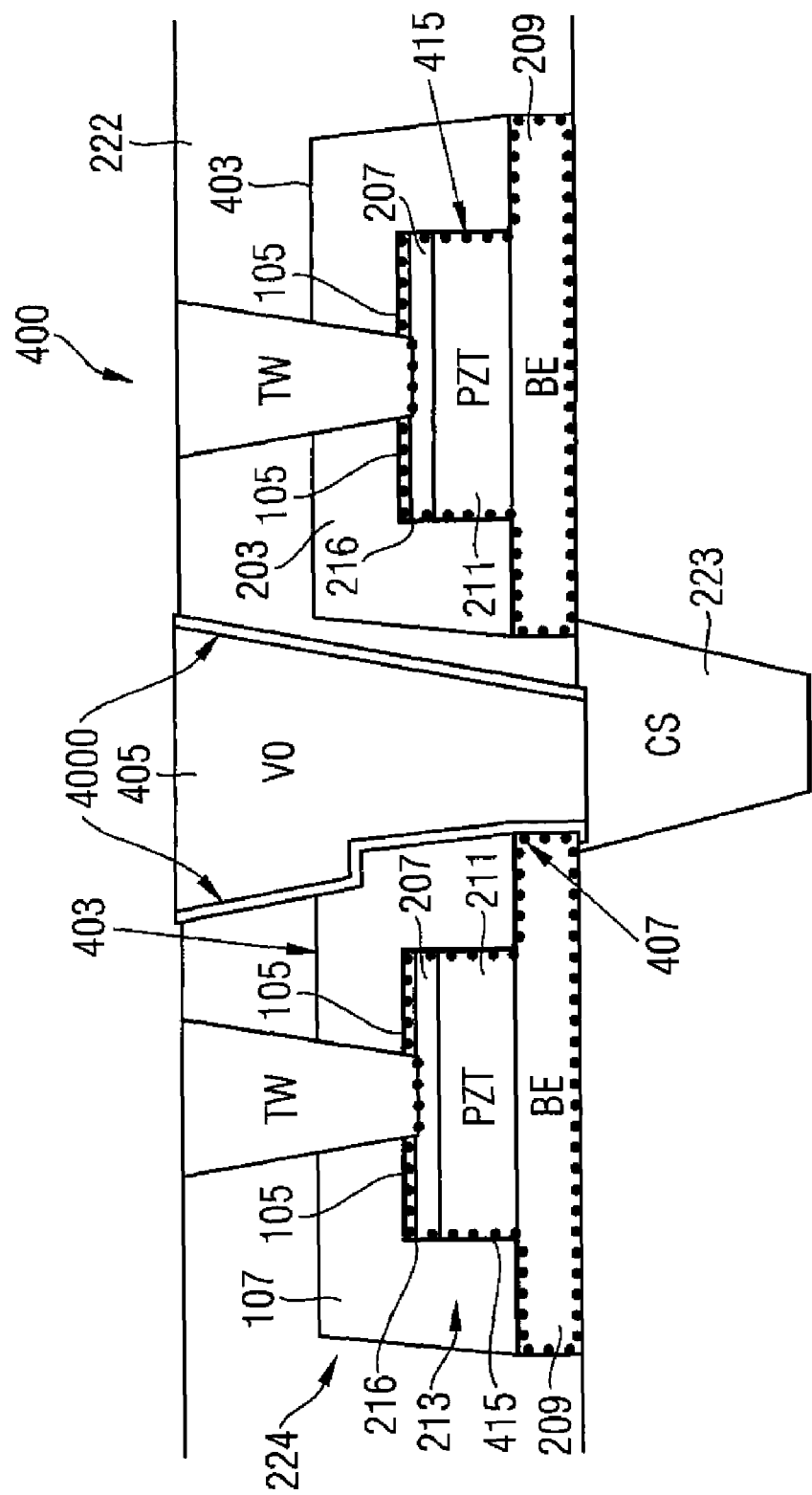

SELF-ALIGNED V0-CONTACT FOR CELL SIZE REDUCTION

CROSS-REFERENCE TO RELATED APPLICATIONS

This application is a divisional of U.S. application Ser. No. 10/677,852, filed Oct. 1, 2003 now U.S. Pat. No. 7,061,035. The disclosure of the prior application is considered part of (and is incorporated by reference in) the disclosure of this application.

FIELD OF THE INVENTION

The present invention relates to the self-alignment of a V0 contact in a FeRAM memory cell for reduction in the size of the memory cell.

BACKGROUND OF THE INVENTION

V0-contacts are contact vias which are used as vertical interconnects between the source/drain of CMOS devices and the metal lines in multilevel interconnect schemes. In prior art FeRAM memories, in order to simplify process development, a huge space is designed in between the V0-contact and the capacitor side wall to avoid shorts and capacitor damage.

FIG. 1 shows a top view of a conventional layout of a V0-mask 101, TW-mask 103, TE-mask 105 and BE-mask 107 of a FeRAM memory chip mask 110. There is a huge space between the V0-mask 101 and the masks 103, 105, 107.

FIG. 2 shows a cross-sectional view of the conventional layout of an FeRAM memory chip 200. A cover layer 201 (solid line) is over a BE-mask 107 (the cover layer can be $Al_2O_3$, for example). The TE 207 and a bottom electrode BE 209 sandwich a PZT ferroelectric layer 211 forming a ferroelectric capacitor 213 of a capacitor stack 223 of the FeRAM memory chip 200. An encapsulation layer 216 (solid line) is deposited onto the TE 207 prior to depositing the TE-mask 105. An encapsulation layer 215 (solid line) covers the ferroelectric capacitor 213. The cover layer 201 and encapsulation layers 215, 216 help protect the ferroelectric capacitor 213 from damage.

A TW-contact 205 extends through the cover layer 201, TE-mask 105, and the encapsulation layers 215, 216, to provide an electrical connection to a top electrode TE 207.

A CS-contact 223 provides a contact to the source/drain of a CMOS device. A V0-contact 221 passes though a dielectric covering 222 and connects electrically to the CS-contact 223. As can be seen, there is a huge space between the V0-contact 221 and a capacitor stack contact 223, making the memory chip 200 large. In the prior art, despite the cover and encapsulation layers, this huge space has been necessary to prevent short circuits and capacitor damage.

It would be desirable to reduce the size of the memory cell and overall FeRAM chip without the resulting short circuits or capacitor damage.

SUMMARY OF THE INVENTION

The present invention provides self-alignment of the V0 contact in a FeRAM memory cell for reduction in the size of the memory cell.

An FeRAM comprising includes a ferroelectric material sandwiched between a top electrode and a bottom electrode. A V0-contact provides an electrical connection with an underlying CS-contact. The V0-contact is aligned using the bottom electrode. A liner layer covers a sidewall of the bottom electrode and provides a stop to an etch a hole forming the V0-contact. A method is utilized to form a V0-contact in an FeRAM comprising. An Fe capacitor of the FeRAM is encapsulated, a bottom electrode is etched, a liner layer is deposited covering a sidewall of the bottom electrode, and a hole is etched for the V0-contact until the etching is stopped by the liner layer.

BRIEF DESCRIPTION OF THE FIGURES

Further preferred features of the invention will now be described for the sake of example only with reference to the following figures, in which:

FIG. 4 shows a cross-sectional view of the layout of an FeRAM memory chip of the present invention.

DETAILED DESCRIPTION OF THE EMBODIMENTS

The present invention provides self-alignment of the V0 contact in a FeRAM memory cell for reduction in the size of the memory cell.

Figure 1:
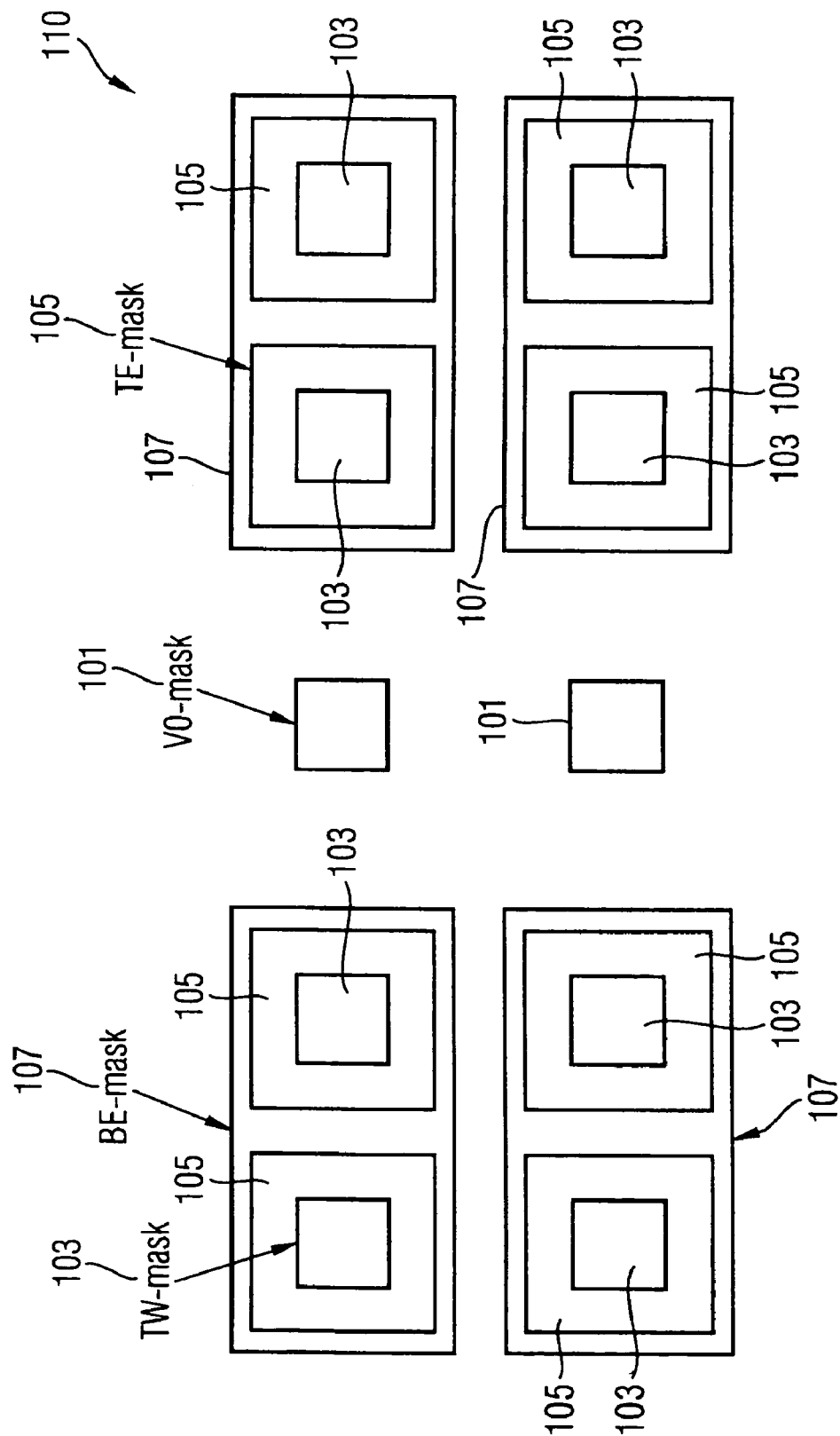
FIG. 1 shows a top view of a conventional layout of a V0-mask, TW-mask, TE-mask and BE-mask of a FeRAM memory chip mask.
Figure 2:
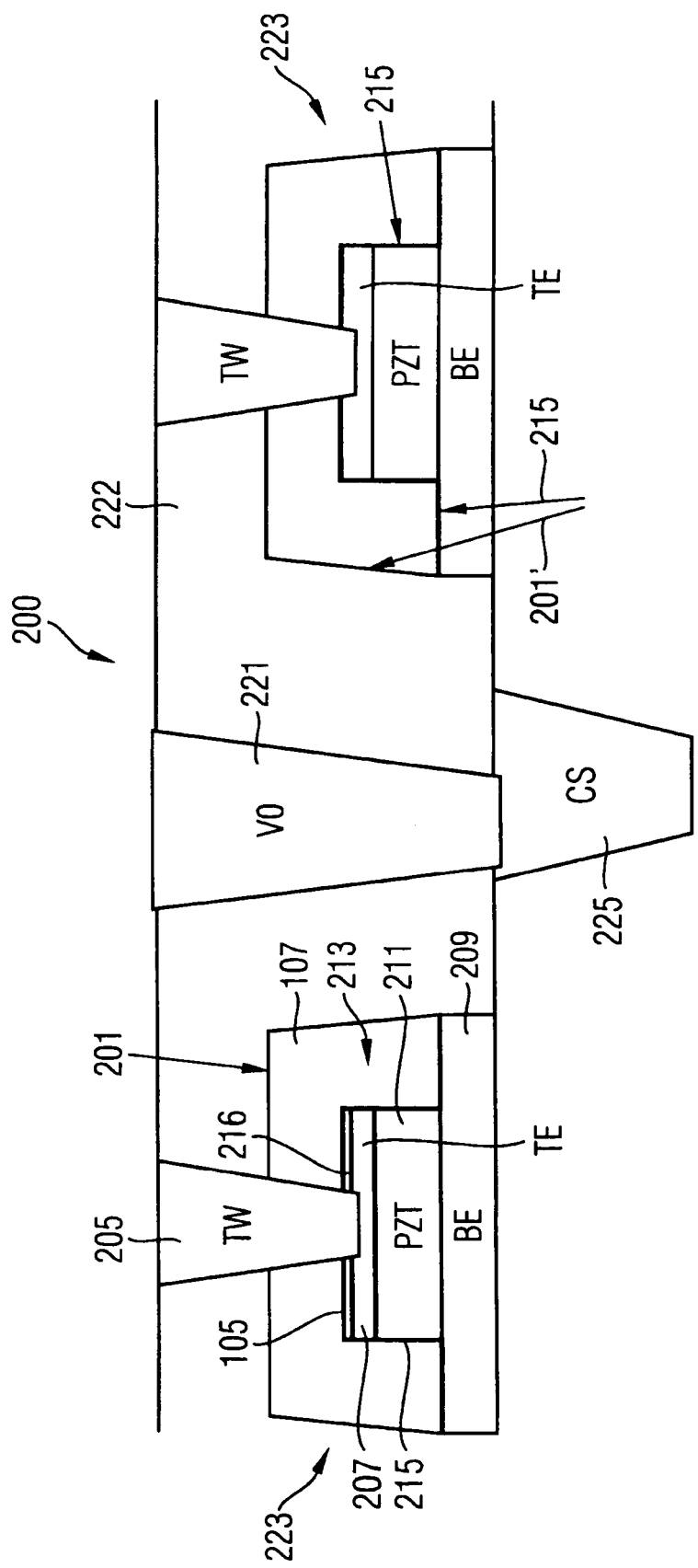
FIG. 2 shows a cross-sectional view of a conventional layout of an FeRAM memory chip.
Figure 3:
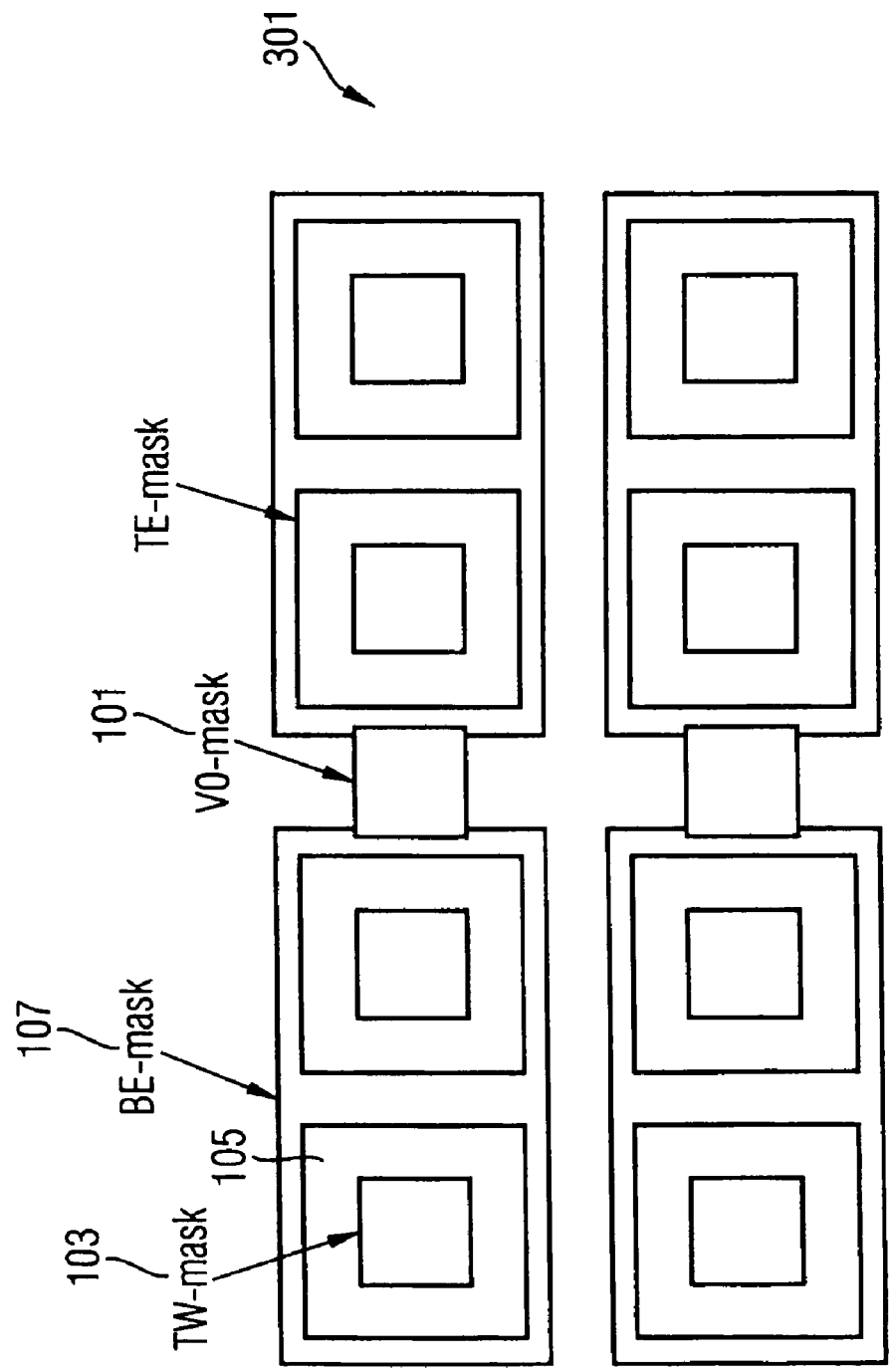
FIG. 3 shows a top view of a layout of a V0-mask, TW-mask, TE-mask and BE-mask of an FeRAM memory chip mask of the present invention.

FIG. 3 shows a top view of a layout of a V0-mask 101, TW-mask 103, TE-mask 105 and BE-mask 107 of a FeRAM memory chip mask 301 of the present invention. As can been seen, in the present invention the huge space between the V0-mask 101 and the masks 103, 105, 107 has been eliminated.

FIG. 4 shows a cross-sectional view of the layout of an FeRAM memory chip 400 of the present invention. To improve the protection for the ferroelectric capacitor 213, a high quality single layer or multi-layer cover is used for an encapsulation layer 415 and a cover layer 403 illustrated in FIG. 4.

The process flow is as follows:

a) Encapsulation of the capacitor 213 is performed as early and as well as possible. One encapsulation layer 216 (solid line) is deposited over the TE 207 before depositing the TE-mask so that it is under the TE-mask, and the encapsulation layer 415 is deposited before depositing the BE-mask 107 so that it is under the BE-mask 107 as is currently done. The TE-mask can be made of TEOS, TiN or other metal, oxide or nitride materials, for example, and can be deposited using such methods as physical vapor deposition (PVD), sputtering, chemical vapor deposition (CVD), or atomic layer deposition (ALD).

b) The BE-electrode 209 is then etched as steeply as possible and the cover layer 403 is deposited. Next the dielectric layer 222 is applied. To protect the capacitor and bottom electrode during etching of the hole for a V0-contact 405 through the layer 222, the cover layer 403 serves as both an etch stop liner and as a cover. A highly selective etch is used which stops on the cover layer-403. Then, an alumina spacer 4000 is deposited on the side walls of the hole. Due to the effect of the spacer, the cover layer 403 remains intact on BE-sidewalls 407. The result is almost vertical BE sidewalls 407, good step coverage for the ALD-deposition of Alumina inside the V0-contact hole 405, highly selective etch of the V0-contact hole 405, and no "noses" (no "noses" means that the sidewalls of the V0-contact hole 405 are smooth), thus providing a good Alumina spacer 4000 deposited on the walls of the V0-contact hole 405.

c) A break-through etch is next used to clean the bottom of the V0-contact 405 and creates an electrical contact with the CS-contact 223 underneath.

This process can be used even when the TE 207 and BE 209 are etched together.

This process also works well with dry etching techniques.

Still other materials and method steps can be added or substituted for those above. Thus, although the invention has been described above using particular embodiments, many variations are possible within the scope of the claims, as will be clear to a skilled reader.

What is claimed is:

1. A method for forming a V0-contact in a ferroelectric random access memory (FeRAM) comprising:
   encapsulating ferroelectric capacitor of the FeRAM;
   etching a bottom electrode;
   depositing a liner layer covering a sidewall of the bottom electrode; and
   etching a hole in which the V0-contact is formed until the etching is stopped by the liner layer.

2. The method of claim 1, further comprising the step of depositing an Alumina spacer on walls of the hole following etching of the hole.

3. The method of claim 1, further comprising the step of performing a break-through etch to clean the bottom of the V0-contact hole so that the V0-contact can electrically connect to an underlying source/drain (CS) contact.

4. A method for forming a V0-contact in a ferroelectric random access memory (FeRAM) comprising:
   providing a liner layer on at least a sidewall of a bottom electrode of a ferroelectric capacitor of the FeRAM;
   providing a dielectric layer over at least the ferroelectric capacitor and/or the liner layer, and
   etching a hole in the dielectric layer for the V0-contact directly adjacent to and/or partially overlying the ferroelectric capacitor, wherein etching of the bottom electrode is prevented by the liner layer.

5. The method claimed in claim 4 further comprising providing an Alumina spacer on a wall of the hole.

6. The method claimed in claim 5 wherein the wall comprises the dielectric layer and the liner layer.

7. The method claimed in claim 4 further comprising break-through etching the bottom of the V0-contact hole and/or the liner layer.

8. The method claimed in claim 7 further comprising depositing a V0-contact in the hole which can electrically connect to a source/drain (CS) contact underneath the bottom of the V0-contact hole.

9. The method claimed in claim 4 wherein the side wall is substantially vertical and is formed by etching the bottom electrode.

10. The method claimed in claim 9 wherein etching the bottom electrode further comprises forming a mask over the bottom electrode and wherein the liner layer is also provided on the mask.

* * * * *